(12) United States Patent
Liang et al.

(10) Patent No.: US 11,906,940 B2
(45) Date of Patent: Feb. 20, 2024

(54) TWO-TIER FEEDBACK CONTROL SYSTEM AND RELATED METHOD

(71) Applicant: xMEMS Labs, Inc., Santa Clara, CA (US)

(72) Inventors: Jemm Yue Liang, Sunnyvale, CA (US); Chieh-Yao Chang, Taipei (TW); Hsi-Sheng Chen, Fremont, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 18/177,765

(22) Filed: Mar. 3, 2023

(65) Prior Publication Data

US 2023/0288884 A1   Sep. 14, 2023

Related U.S. Application Data

(63) Continuation-in-part of application No. 18/048,852, filed on Oct. 23, 2022, now Pat. No. 11,757,360.
(Continued)

(51) Int. Cl.
  *G05B 13/04* (2006.01)
(52) U.S. Cl.
  CPC ................... *G05B 13/042* (2013.01)
(58) Field of Classification Search
  None
  See application file for complete search history.

(56) References Cited

U.S. PATENT DOCUMENTS

| 5,734,258 A | 3/1998 | Esser |
| 6,088,243 A | 7/2000 | Shin |

(Continued)

FOREIGN PATENT DOCUMENTS

| CN | 102422346 A | 4/2012 |
| CN | 106803752 A | 6/2017 |

(Continued)

OTHER PUBLICATIONS

Liu, "A Two-Tier Control Architecture for Nonlinear Process Systems with Continuous/Asynchronous Feedback", Jun. 2009, 2009 American Control Conference, pp. 1-8 relates to claims 1, 6, 17, 22 and 24 regarding two-tier control architecture for nonlinear process systems and transfer functions. (Year: 2009).*

*Primary Examiner* — Mohammad Ali
*Assistant Examiner* — David Earl Ogg
(74) *Attorney, Agent, or Firm* — Winston Hsu (57) ABSTRACT

The present invention discloses a feedback control system. The feedback control system comprises a plant, configured to produce an output according to a control signal; a first summing block, configured to produce a first difference between an input signal and a measured output signal; a first controller, configured to generate the control signal, such that the first difference decreases to be less than a first threshold or is less than the first threshold; wherein the first controller comprises a memory configured to store a table, and the table contains information of a plurality of transfer functions corresponding to a plurality of operating conditions; wherein the first controller determines an operating condition under which the plant operates, and chooses to utilize a transfer function corresponding to the operating condition to generate the control signal according to the transfer function and the first difference.

23 Claims, 7 Drawing Sheets

Related U.S. Application Data (60) Provisional application No. 63/435,214, filed on Dec. 23, 2022, provisional application No. 63/269,041, filed on Mar. 8, 2022.

(56) References Cited

U.S. PATENT DOCUMENTS

| | | | |
|---|---|---|---|
| 6,166,527 A | 12/2000 | Dwelley | |
| 6,191,567 B1 | 2/2001 | Sluijs | |
| 6,215,286 B1 | 4/2001 | Scoones | |
| 6,299,272 B1 * | 10/2001 | Baker | B41J 2/14008 347/10 |
| 6,348,779 B1 | 2/2002 | Sluijs | |
| 6,984,967 B2 | 1/2006 | Notman | |
| 7,391,190 B1 | 6/2008 | Rajagopalan | |
| 7,609,040 B1 | 10/2009 | Jain | |
| 7,923,980 B2 | 4/2011 | Takahashi | |
| 8,400,130 B2 | 3/2013 | Latham | |
| 8,975,826 B1 | 3/2015 | Stevens | |
| 8,976,543 B1 | 3/2015 | Zheng | |
| 9,225,264 B1 | 12/2015 | Fedigan | |
| 2007/0176587 A1 * | 8/2007 | Lipcsei | H02M 3/1582 323/283 |
| 2009/0296805 A1 * | 12/2009 | Takahashi | H03K 7/08 375/238 |
| 2011/0235831 A1 | 9/2011 | Kaiho | |
| 2013/0223565 A1 | 8/2013 | McCallister | |
| 2016/0091541 A1 * | 3/2016 | Matsui | G06F 30/36 702/75 |
| 2016/0268889 A1 * | 9/2016 | Henzler | H02M 3/04 |
| 2016/0282820 A1 * | 9/2016 | Perez | G05B 13/047 |
| 2018/0308467 A1 * | 10/2018 | Yamkovoy | G10K 11/17833 |
| 2019/0081621 A1 | 3/2019 | Schinkel | |
| 2021/0143767 A1 * | 5/2021 | Roadley-Battin | G05B 19/4062 |
| 2021/0391869 A1 * | 12/2021 | Deford | H01J 49/022 |
| 2022/0021305 A1 | 1/2022 | Dearborn | |
| 2022/0209647 A1 | 6/2022 | Yamada | |
| 2022/0308531 A1 | 9/2022 | Takano | |

FOREIGN PATENT DOCUMENTS

| | | | |
|---|---|---|---|
| CN | 109634124 A * | 4/2019 | |
| CN | 110521215 A | 11/2019 | |
| CN | 111245403 A | 6/2020 | |
| CN | 112366939 A | 2/2021 | |
| EP | 3 443 667 B1 | 6/2020 | |
| JP | 2006-87194 A | 3/2006 | |
| JP | 2006-295802 A | 10/2006 | |
| JP | 6642144 | 2/2020 | |
| JP | 2021-64982 A | 4/2021 | |
| TW | 201308850 A1 | 2/2013 | |
| TW | I462454 B | 11/2014 | |
| TW | 201547173 A | 12/2015 | |
| TW | 201607219 A | 2/2016 | |
| TW | 201607228 A | 2/2016 | |

* cited by examiner

TWO-TIER FEEDBACK CONTROL SYSTEM AND RELATED METHOD

CROSS REFERENCE TO RELATED APPLICATIONS

This application is a continuation-in-part of U.S. application Ser. No. 18/048,852, filed on Oct. 23, 2022, which claims the benefit of U.S. Provisional Application No. 63/269,041, filed on Mar. 8, 2022. Further, this application claims the benefit of U.S. Provisional Application No. 63/435,214, filed on Dec. 23, 2022. The contents of these applications are incorporated herein by reference.

BACKGROUND OF THE INVENTION

1. Field of the Invention

The present application relates to a feedback control system, and more particularly, to a feedback control system capable of producing consistent outcome under various operating conditions.

2. Description of the Prior Art

Figure 1A:
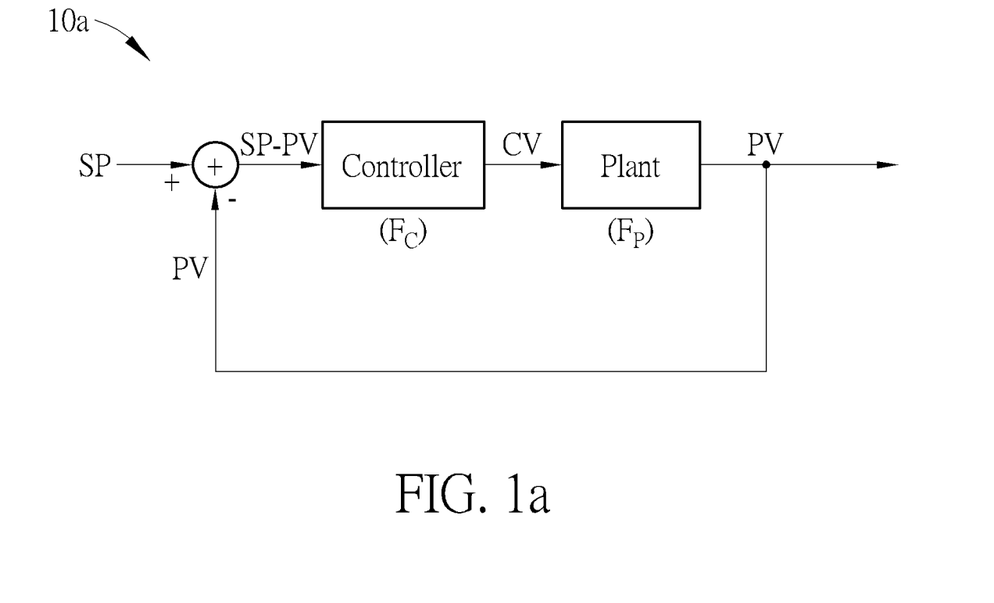
FIG. 1a and FIG. 1b are schematic diagrams of feedback control systems.
Figure 1B:
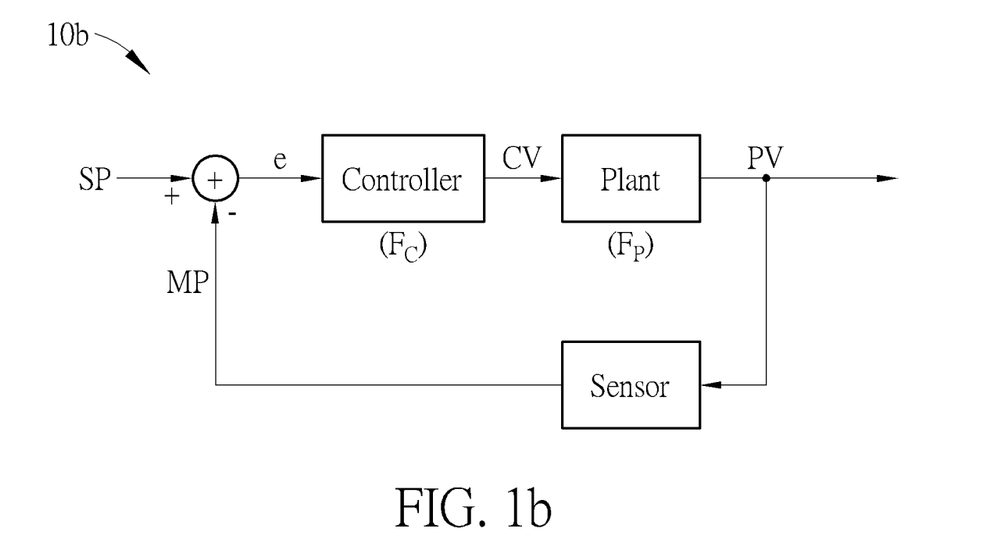

Feedback control system (FCS), or closed-loop control system, is widely applied in various applications. Schematic diagram of conventional feedback control system (denoted as $10a$ or $10b$) are shown in FIG. $1a$ or $1b$. Several applications are listed in Table I as examples.

FCS receives setpoint SP, representing desired or target value which FCS intend to achieve. FCS compares process variable (PV), regarded as system output, being controlled with the desired value or setpoint (SP). The process variable PV may be monitored by sensor which produces measured process variable MP as feedback signal.

Controller controls plant via control variable CV according to SP-PV error (or measured error e), such that process variable PV approaches setpoint SP, e.g., $|SP-PV|<\varepsilon$, where $\varepsilon$ (as certain threshold determined according to practical situation) may represent tolerance between SP and PV.

TABLE I

| Applications | SP | PV | Plant |
|---|---|---|---|
| Vehicle cruise control or aircraft | Desired speed | Vehicle/aircraft speed | Vehicle/aircraft engine |
| Thermostat | Desired temperature | building temperature | heater |
| DC-DC converter | Desired voltage | Output voltage | DC-DC converting circuit |

FCS may be further extended to be used under context of tracking system, where setpoint SP and process variable PV are time-varying, and controller pursues a converge condition where $|SP(t)-PV(t)|<\varepsilon$, where SP(t) and PV (t) represent time-varying function of SP and PV, and $|\cdot|$ represents absolute value operator.

In the context of FIGS. $1a$ and $1b$, controller may be a single-input-single-output (SISO) system with transfer function $F_C$. The controller receives measured error e or SP-PV error and determines/outputs control variable CV. The input-output relationship can be described by the transfer function $F_C$, i.e., $CV=F_C(e)$ or $CV=F_C(SP-PV)$. An objective of the controller or transfer function $F_C$ is to produce the control variable CV such that PV approaches SP.

Operation of the plant would be affected by various factors (or operating conditions), and PV would be affected and deviated from the expected value/behavior due to those factors (operating conditions).

For example, the plant may experience disturbance while operating, and the disturbance would cause the plant produce deviated PV.

Practically, the factors (operating conditions) may vary while the plant operates. For example, given vehicle may occasionally travel through a hill with ascending/descending slope, acceleration needed for engine (the plant) shall be different from which of traveling on flat ground.

One solution of dealing with various operating conditions is to parameterize the controller transfer function with respect to parameter(s) representing the factor(s) or operating condition(s).

However, it is complicate or even impossible to express one (parameterized) transfer function in a universal way to incorporate/fit all kinds of parameters/factors. Suppose the factors (operating conditions) are stationary or static, complications of finding universal transfer function may be at least due to following reasons:

There are too many factors which affect operation of plant

Parameter might be continuous (variable), which means there are infinite number of possible transfer function Some factors are not observable, and it is hard for controller to choose the transfer function in response to the non-observable factor.

In addition, the factors (operating conditions) may be time-varying, and transfer function $F_C$ or $F_P$ shall morph over time. For example, a battery voltage (which may function as one factor) would be naturally weakened while the plant (which may need battery) operates. Time-variant factors of the plant make modeling the universal transfer function complicated.

Characteristics of components (e.g., capacitance, inductance, or resistance) within the plant usually vary component-by-component. Variation of those component characteristics may also affect PV produced by the plant, which makes modeling the universal transfer function complicated as well.

Further, the input-output relationship of the plant is usually nonlinear. In some applications where linearity (between input and output) is a figure of merit thereof, nonlinearity shall be taken into consideration.

Therefore, how to improve over the disadvantages of the prior art is a significant objective in the field.

SUMMARY OF THE INVENTION

It is therefore a primary objective of the present application to provide a feedback control system capable of producing consistent outcome under various operating conditions, to improve over disadvantages of the prior art.

An embodiment of the present invention discloses a feedback control system. The feedback control system comprises a plant, configured to produce an output according to a control signal; a first summing block, configured to produce a first difference between an input signal and a measured output signal; a first controller, configured to generate the control signal, such that the first difference decreases to be less than a first threshold or is less than the first threshold; wherein the first controller comprises a memory configured to store a table, and the table contains information of a plurality of transfer functions corresponding to a plurality of operating conditions; wherein the first controller determines an operating condition under which the plant operates, and chooses to utilize a transfer function corresponding to the operating condition to generate the control signal according to the transfer function and the first difference.

Another embodiment of the present invention discloses a method applied in a feedback control system. The feedback control system comprises a plant configured to produce an output according to a control signal. The method comprises determining an operating condition under which a plant operates; choosing to utilize a transfer function corresponding to the operating condition among a plurality of transfer functions; and generating the control signal according to the transfer function. The feedback control system comprises a memory configured to store a table, and the table contains information of the plurality of transfer functions corresponding to a plurality of operating conditions.

These and other objectives of the present invention will no doubt become obvious to those of ordinary skill in the art after reading the following detailed description of the preferred embodiment that is illustrated in the various figures and drawings.

DETAILED DESCRIPTION

Regarding the various factors affecting the plant operation which are observable, the controller may have several transfer functions $F_{C,m}$ stored within the controller (before the FCS operates), where the transfer function $F_{C,m}$ is corresponding to the m-th operating condition. The controller may observe and determine that the plant is under the m-th operating condition and choose/determine to exploit $F_{C,m}$ as the transfer function to produce control variable CV, according to the SP-PV error.

In the present application, (components within) feedback control system of the present application may be implemented via logic circuit, e.g., ASIC (Application Specific Integrated Circuit), processor, and the like, or some existing module(s) or circuit component(s), which is not limited thereto.

Figure 2:
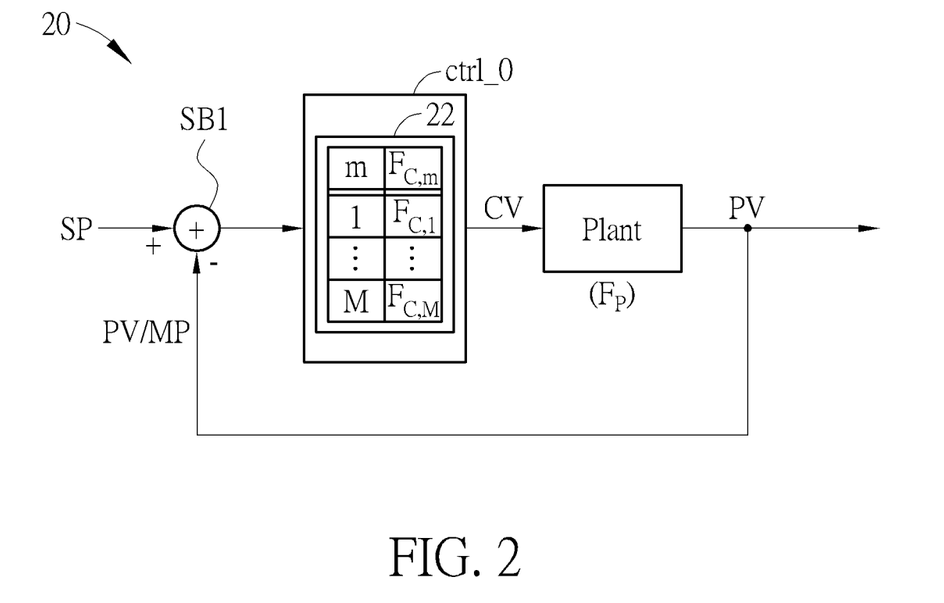
FIG. 2 is a schematic diagram of a feedback control system according to an embodiment of the present application.

FIG. 2 illustrates an FCS 20 according to an embodiment of the present application. FCS 20 is similar to FCS 10a illustrated in FIG. 1a. Different from the FCS 10a, FCS 20 comprises a controller ctrl_0. The controller ctrl_0 comprises a memory 22. The controller ctrl_0 may either have a plurality of control transfer functions $F_{C,1} \sim F_{C,M}$ stored directly therein, or the controller ctrl_0 may own information or parameters based on which the transfer functions $F_{C,1} \sim F_{C,M}$ can be obtained or fully reproduced/reconstructed, where Information/parameters of the control transfer functions $F_{C,1} \sim F_{C,M}$ or the functions $F_{C,1} \sim F_{C,M}$ themselves may be stored in the memory 22.

Based on signal which can be observed by the controller ctrl_0 (e.g., SP or PV/MP), the controller ctrl_0 is able to determine which operating condition the plant is currently under, and then the controller ctrl_0 would choose to use the corresponding transfer function to produce control variable CV. For example, the controller ctrl_0 may determine the plant is under operating condition m (where m is operating condition index) according to signal(s) which is observable to the controller ctrl_0, and then choose to use the corresponding transfer function $F_{C,m}$ to produce control variable CV according to the SP-PV or SP-MP error.

Furthermore, regarding the nonlinearity, a divide-and-conquer approach, by chopping the whole system (e.g., the plant) into multiple piece-wise linear sub-systems or by regarding the entire system (e.g., the plant) as an aggregation of a plurality of piece-wise linear sub-systems, is adopted. One way to approach this is to discretize the transfer function, e.g., $F_{C,i}$, into a format of a row vector within a table. In this way, referring to the transfer function to produce control variable CV is equivalent to looking-up the table to produce control variable CV.

Combining ideas of holding multiple transfer functions at/by the controller and discretizing the multiple transfer functions, a 2-dimensional (2D) mapping table may be stored in the controller, where row i of the table represents discretized format of transfer function $F_{C,i}$ corresponding to the operating condition i. Note that, row index (in the present application) is also regarded as operating condition index.

In an embodiment, discretizing a transfer function (e.g., $F_{C,i}(e)$) within continuous input variable (e.g., SP-PV error) may be similar to a temporal sampling process which samples a time-varying function (e.g., x(t)) to extracts $x(nT_S)$. In this case, the discretized format of transfer function $F_{C,i}$ can be expressed as $[F_{C,i}]_D = [F_{C,i}(\Delta), F_{C,i}(2 \cdot \Delta), \ldots, F_{C,i}(N \cdot \Delta)]$ (eq. 1), where $[\cdot]_D$ defines a discretization operator corresponding to a discretization process, and $\Delta$ is a unit step size for the discretization process, an analogy to the sampling interval $T_S$ in the temporal sampling process.

In eq. 1, the discretization process extracts function values corresponding to input argument (e.g., e) being integer multiple of step size ($\Delta$, where $e = n \cdot \Delta$), which is not limited thereto. Input arguments for the discretizing process may follow any specific distribution of $\Delta$. It means, discretized transfer function $F_{C,i}$ can be expressed $[F_{C,i}]_D = [F_{C,i}(\Delta_1), F_{C,i}(\Delta_2), \ldots, F_{C,i}(\Delta_n), \ldots, F_{C,i}(\Delta_N)]$, and $\Delta_n$ may be variant with respect to n, depending on practical requirement, which is within the scope of the present invention.

Figure 3:
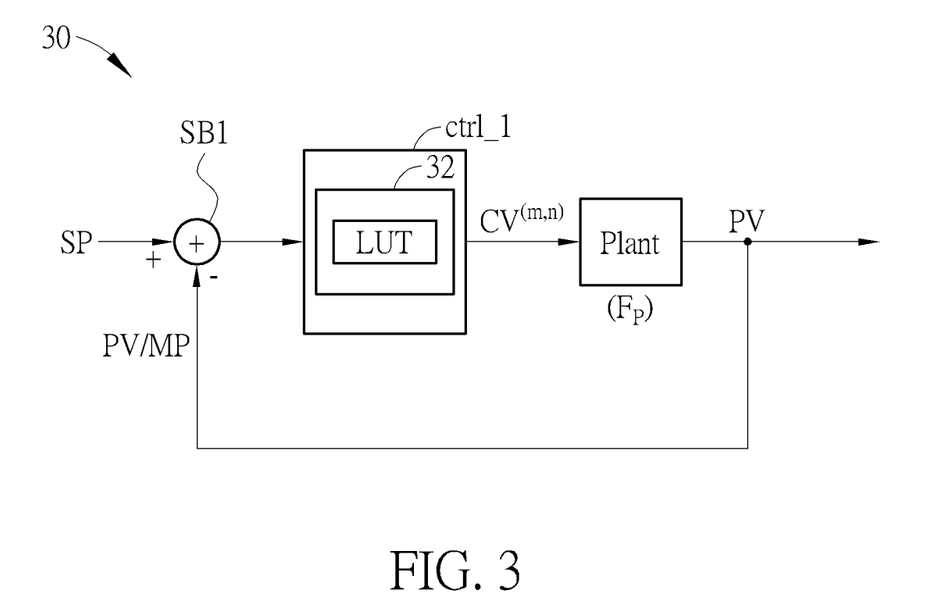
FIG. 3 is a schematic diagram of a feedback control system according to an embodiment of the present application.

FIG. 3 illustrates an FCS 30 according to an embodiment of the present application. FCS 30 is similar to FCS 20. Different from FCS 20, FCS 30 comprises a controller ctrl_1, and the controller ctrl_1 comprises a memory 32 having a 2D table LUT stored therein. In the present application, LUT may represent either notation of the 2D table or an abbreviation of the term lookup table, which are used interchangeably.

As mentioned earlier, the m-th row (or row m) of the table LUT represents the discretized format of transfer function $F_{C,m}$, e.g., $[F_{C,m}]_D=[F_{C,m}(\Delta), F_{C,m}(2\cdot\Delta), \ldots, F_{C,m}(N\cdot\Delta)]$, and each entry of row m (denoted as $F_{C,m}(n\cdot\Delta)$) is a representative value of a segment (e.g., segment n) of the transfer function $F_{C,m}$. In this regard, column index here is also regarded as segment index.

According to signal(s) can be observed (or information can be collected) by the controller ctrl_1 (e.g., SP or PV/MP, or other input to/of controller ctrl_1), the controller ctrl_1 is able to determine which operating condition the plant is currently under. In other words, according to observable signals or information collected by the controller ctrl_1, the controller ctrl_1 may determine operating condition index m as row index m of the table LUT. On the other hand, according to the SP-PV error (or measured error e shown in FIG. 1b), the controller ctrl_1 may determine which segment of the transfer function $F_{C,m}$ it (ctrl_1) likes to refer to. That is, according to the SP-PV error (or SP-MP error, i.e., measured error e), the controller ctrl_1 may determine segment index n, i.e., column index n of the table LUT.

Sensor within FCS is omitted in FIG. 2 and FIG. 3 for brevity. Practically, sensor may be included as FIG. 1b. Hence, the summing block SB1 may receive PV or MP. In some situation, PV received by summing block SB1 may also be referred as MP, measured process variable or measured output.

Given tuple (m, n), indicating row address and column address of table LUT, the controller ctrl_1 may look up the table LUT and fetch the entry at the address (m, n) of table LUT, and produce control variable $CV^{(m, n)}$ according to the (m, n)-th entry of table LUT or directly produce control variable $CV^{(m, n)}$ as the (m, n)-th entry of table LUT.

Regarding the time-variant transfer functions (or table), an adaptive/learning mechanism may be adopted to adjust the transfer functions or the table, accommodating factors which are time-varying, component-wise variant, or even non-observable. The adaptive algorithm may also be realized by a feedback control mechanism.

Figure 4:
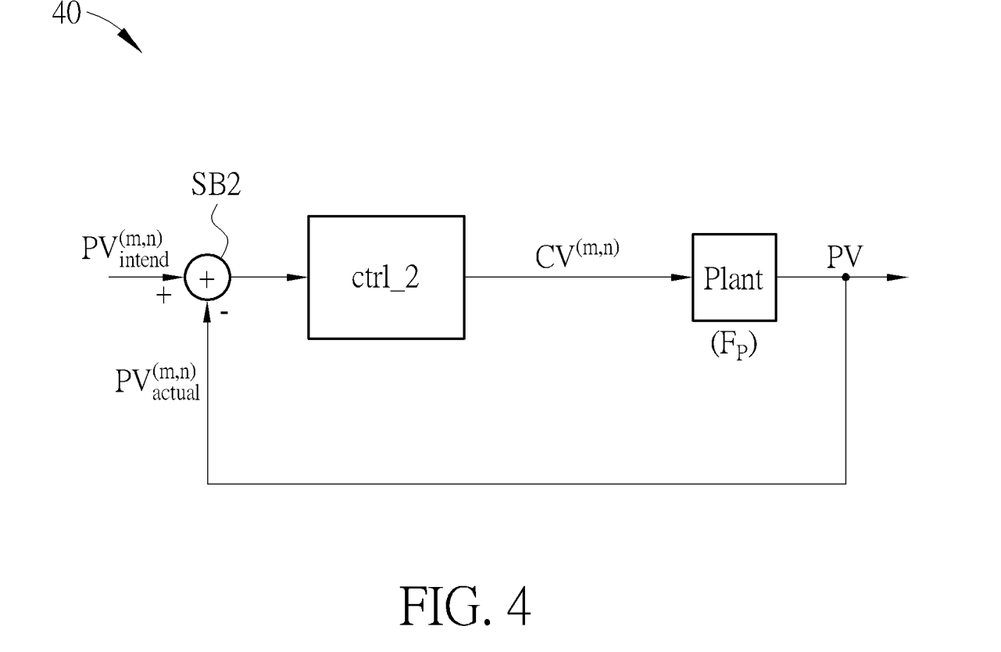
FIG. 4 is a schematic diagram of a feedback control scheme according to an embodiment of the present application.

FIG. 4 illustrates a feedback control scheme 40 according to an embodiment of the present application. The feedback control scheme 40 is configured to maintain reliability and/or validity of the table LUT (shown in FIG. 3) or the multiple transfer functions (shown in FIG. 2) when/as time goes by, given some factors affecting operation of the plant vary over time or vary component-by-component.

In an embodiment, the feedback control scheme 40 may be embedded inside the FCS 30. For example, the controller ctrl_2 and the summing block SB2 shown in FIG. 4 may be a part of circuit within the controller ctrl_1 within the FCS 30, and the plant shown in FIG. 4 and the plant shown in FIG. 3 may be the same device.

Referring to FIG. 4, when the control variable $CV^{(m, n)}$ is outputted to the plant, the controller ctrl_1 may have information of $PV_{intend}^{(m,n)}$, which is an intended value of PV when $CV^{(m,n)}$ is applied to the plant. The controller ctrl_1 provides $PV_{intend}^{(m,n)}$ to the feedback control scheme 40. Similar to the FCS 10, the controller ctrl_2 tries to adjust $CV^{(m, n)}$ so that $PV_{actual}^{(m,n)}$ approaches $PV_{intend}^{(m,n)}$, where $PV_{intend}^{(m,n)}$ functions as a role of setpoint for the feedback control scheme 40.

Figure 5:
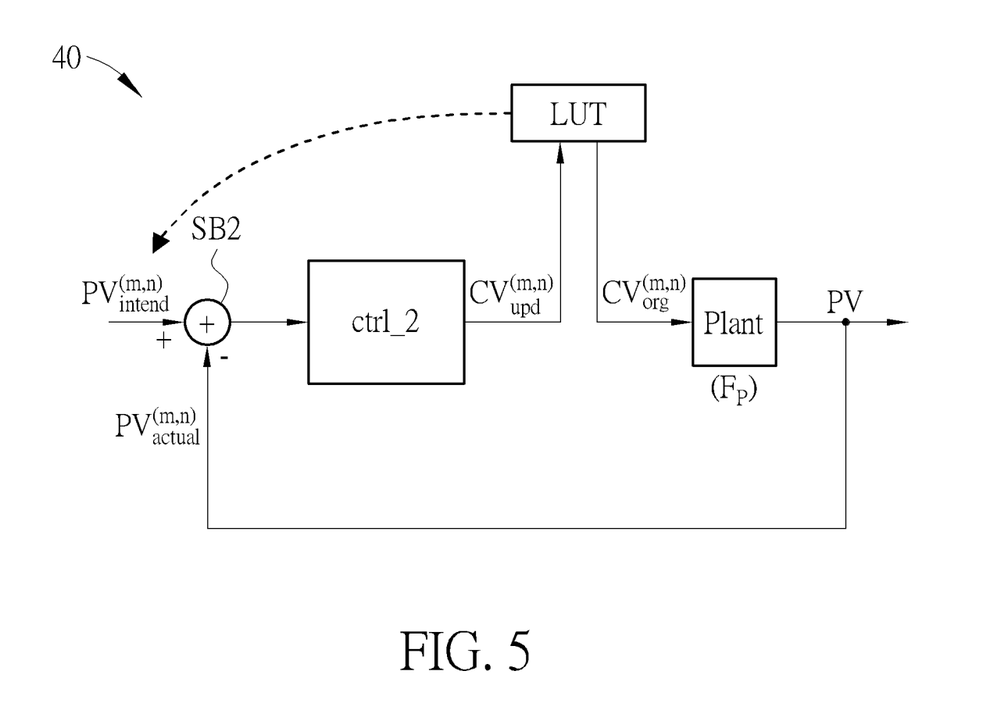
FIG. 5 illustrates details of the feedback control scheme of FIG. 4.

Details of the feedback control scheme 40 can further be referred to FIG. 5. Once the (m, n)-th entry of table LUT is fetched to produce control variable, the controller ctrl_1 would inform the feedback control scheme 40 about $PV_{intend}^{(m,n)}$ and output the original control variable $CV_{org}^{(m,n)}$ to the plant. The plant operates according to $CV_{org}^{(m,n)}$, and resulting $PV_{actual}^{(m,n)}$ is fedback to summing block SB2. The summing block SB2 produces an error $PV_{intend}^{(m,n)}-PV_{actual}^{(m,n)}$. According to the error $PV_{intend}^{(m,n)}-PV_{actual}^{(m,n)}$, the controller ctrl_2 generates an updated control variable $CV_{upd}^{(m,n)}$ (or generate parameters based on which the updated control variable $CV_{upd}^{(m,n)}$ can be generated), in order to minimize $|PV_{intend}^{(m,n)}-PV_{actual}^{(m,n)}|$. The updated control variable $CV_{upd}^{(m,n)}$ (or the relative parameters) would be written back to the LUT on the address (m,n).

Note that, arrows shown in FIG. 5 labeled as $CV_{org}^{(m,n)}$ and $CV_{upd}^{(m,n)}$ may directly refer to $CV_{org}^{(m,n)}$ and $CV_{upd}^{(m,n)}$ themselves, or may refer to information/parameter(s) based on which $CV_{org}^{(m,n)}$ and $CV_{upd}^{(m,n)}$ can be generated.

In a perspective, FIG. 5 illustrates the feedback control scheme 40 operates particular for the (m, n)-th entry of table LUT. An iteration of the feedback control scheme 40 shown in FIG. 5 may be initiated when the (m, n)-th entry of table LUT is fetched and be ended when the (m, n)-th entry of table LUT is rewritten. In another iteration, the feedback control scheme 40 may work for another (m', n')-th entry, and the adaptation for the (m, n)-th entry is temporality frozen.

Figure 6:
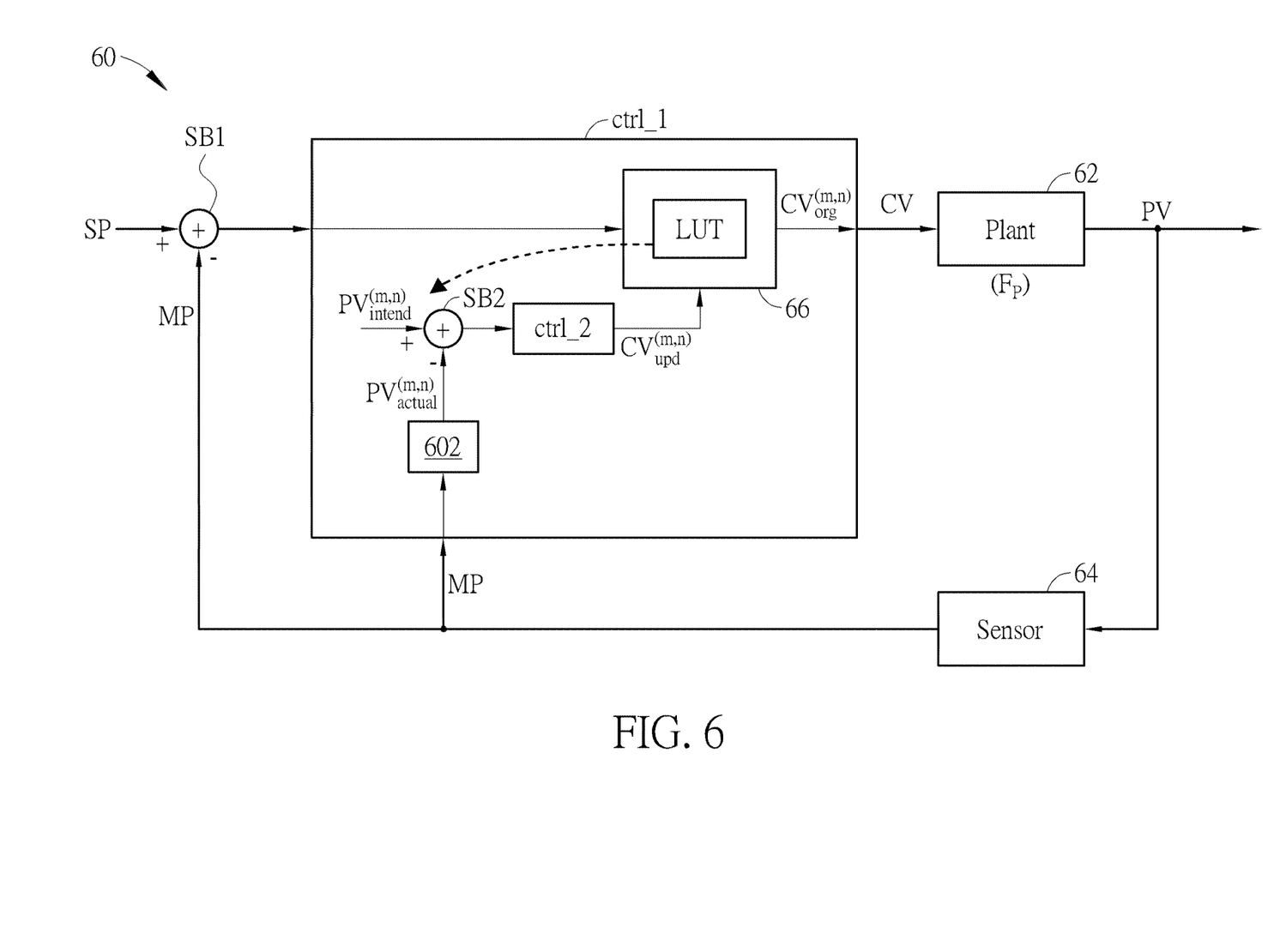
FIG. 6 is a schematic diagram of a feedback control system according to an embodiment of the present application.

By combining the FCS 30 and the feedback control scheme 40, a two-tier feedback control system 60 is proposed in the present application and illustrated in FIG. 6. The feedback control system 60 comprises two tiers of feedback control schemes therein.

The $1^{st}$ tier feedback control scheme, comprising the summing block SB1, the controller ctrl_1, the plant 62 and the sensor 64, shown in bold solid line in FIG. 6, is configured to generate control variable CV, such that process variable PV (or measured process variable MP) approaches setpoint SP, based on the LUT (representing multiple control transfer functions) stored within a memory 66 included in the controller ctrl_1. The LUT allows the controller ctrl_1 choose suitable control transfer function to produce control variable among a variety of observable operating conditions. That is, in the $1^{st}$ tier feedback control scheme, the controller ctrl_1 looks up the LUT stored therein, in order to generate the control variable CV as optimal as possible (i.e., fitting the operating condition which the plant 62 is under). Detail operations of the $1^{st}$ tier feedback control scheme can be referred to which of the FCS 30, which are not narrated herein.

The $2^{nd}$ tier feedback control scheme, comprising the summing block SB2, the controller ctrl_2, the plant 62 and the sensor 64 (where the summing block SB2 and the controller ctrl_2 are embedded inside the controller ctrl_1, and the plant 62 and the sensor 64 are shared with the $1^{st}$ tier feedback control scheme), is configured to update the LUT (representing the transfer functions) adapt to time-vary factors or component-wise variation which usually are unobservable. In FIG. 6, sub-circuit 602 is configured to compute $PV_{actual}^{(m,n)}$ according to measured process variable MP. Detail operations of the $2^{nd}$ tier feedback control scheme can be referred to which of the feedback control scheme 40, which are not narrated herein.

In a short remark, given operation of the plant would be affected by various factors or operating conditions, the FCS 60 utilities the $1^{st}$ tier feedback control scheme to overcome variation(s) brought by factors or operating conditions which are observable, and utilities the $2^{nd}$ tier feedback control scheme to overcome variation(s) brought by factors or operating conditions which are unobservable.

In addition to the applications listed in Table I, FCS may be applied to audio driving system. For example, U.S. application Ser. No. 18/048,852 discloses an audio driving circuit or audio driving system, which is configured to drive a PZT actuated MEMS speaker. The driving circuit disclosed in Ser. No. 18/048,852 may be interpreted as a two-tier feedback control system.

Figure 7:
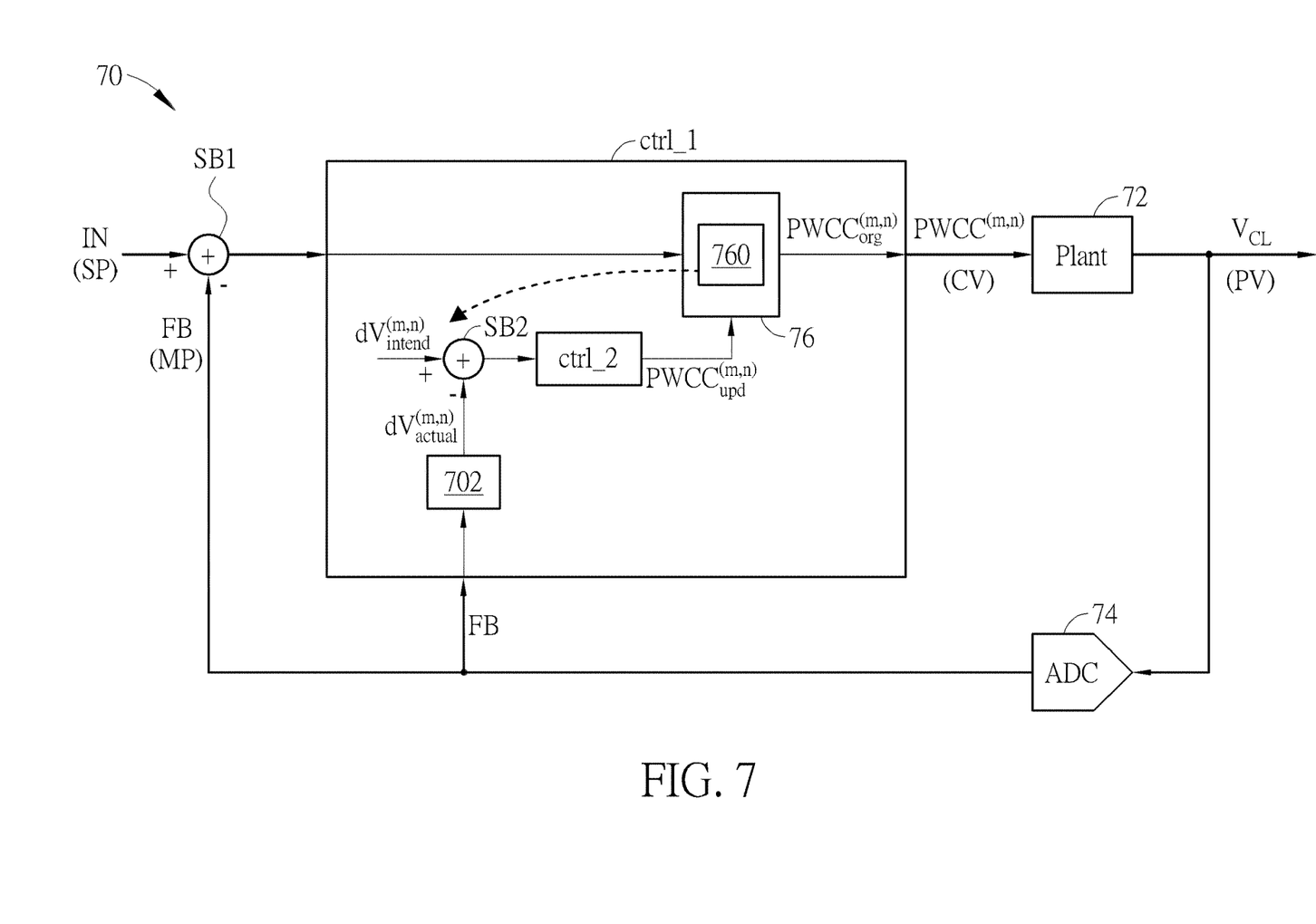
FIG. 7 is a schematic diagram of a feedback control system according to an embodiment of the present application.

FIG. 7 illustrates a circuit 70 according to an embodiment of the present application. Most of the operations of the circuit 70 are taught in Ser. No. 18/048,852, such that the circuit 70 can be viewed as a re-interpretation of the driving circuit disclosed in Ser. No. 18/048,852, especially in a perspective of feedback control scheme/system. As taught in Ser. No. 18/048,852, the circuit 70 is configured to drive a capacitive load. As an embodiment in Ser. No. 18/048,852, the circuit 70 may be an audio driving system to drive a PZT (lead zirconate titanate) actuator, which is highly capacitive.

Besides the summing block SB1 and the controller ctrl_1, the circuit 70 comprises a plant 72 and an analog-to-digital converter (ADC) 74. The summing block SB1, the controller ctrl_1, the plant 72 and the ADC 74 form as the $1^{st}$ tier feedback control scheme. The voltage across the capacitive load (e.g., PZT actuator), denoted as $V_{CL}$, may be interpreted as the process variable PV (of the $1^{st}$ tier feedback control scheme). ADC 74 functions as the sensor (of the $1^{st}$ tier feedback control scheme). Output of the ADC 74, shown as the feedback signal FB in FIG. 7, can be interpreted as the measured process variable MP (of the $1^{st}$ tier feedback control scheme).

In order to driving capacitive load, the PZT actuator, in an embodiment, the driving circuit 70 may perform charging or discharging operation thereon. The (dis)charging operation may be controlled by pulse width modulation (PWM) signals. Specifically, pulse width of the PWM signal for the charging operation determines an increment on the $V_{CL}$, and pulse width of the PWM signal for the discharging operation determines a decrement on the $V_{CL}$.

As taught in U.S. Pat. No. 11,271,480 B2, in order to finely control the pulse width of the PWM signal, pulse width control code (PWCC) may be utilized to generate PWM signal accordingly. In a perspective, the PWCC herein can be interpreted as the control variable CV within the FCS 70, as shown in FIG. 7.

In this regard, given that input signal IN can be interpreted as the setpoint SP, an objective of the FCS 70 is to produce appropriate PWCC (the control variable) to control the plant 72, such that $V_{CL}$ (the process variable PV) or the feedback signal FB (the measured process variable MP) approaches the input signal IN (the setpoint SP), e.g., $|IN-FB|<\varepsilon_1$, where $\varepsilon_1$ (as certain threshold determined according to practical situation) may represent tolerance between IN and FB.

Figure 8:
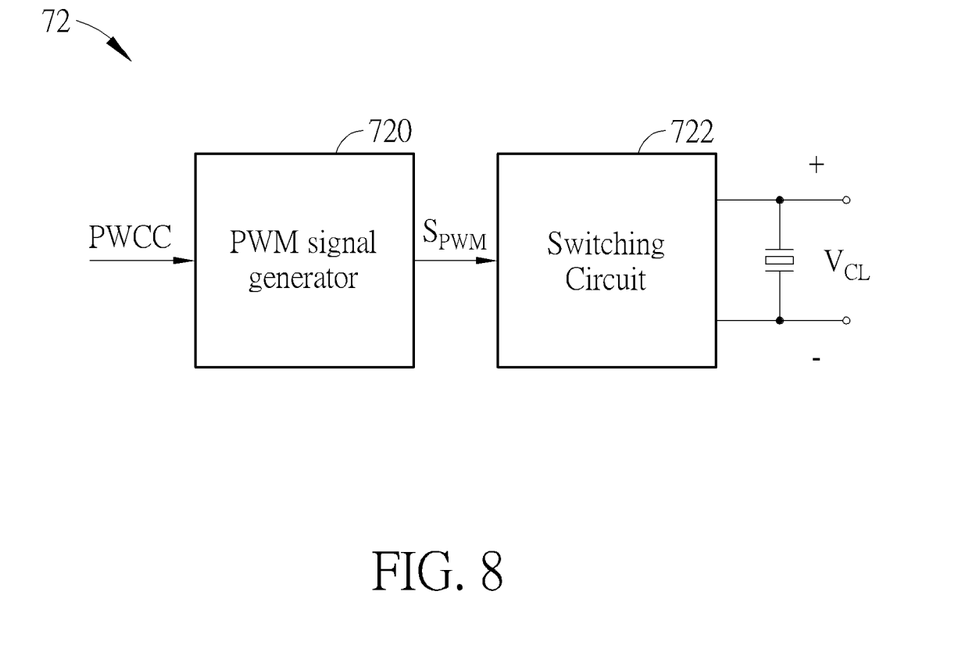
FIG. 8 is a schematic diagram of a plant according to an embodiment of the present application.

The plant 72 may comprise a PWM signal generator 720 and a switching circuit 722, as shown in FIG. 8. The PWM signal generator 720 generates PWM signal(s) $S_{PWM}$ according to the PWCC. The switching circuit 722 performs the charging or discharging operation according to the PWM signal(s) $S_{PWM}$, such that the voltage across the PZT actuator or the load voltage $V_{CL}$ would be increased or decreased within a DC-DC cycle.

Figure 9:
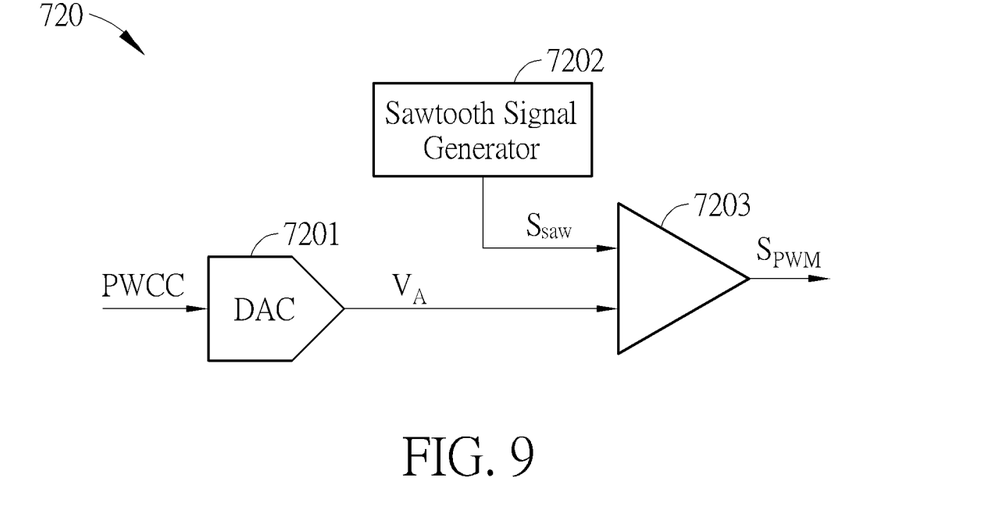
FIG. 9 is a schematic diagram of a PWM signal generator according to an embodiment of the present application.

The PWM signal generator 720 may comprise a digital-to-analog converter (DAC) 7201, a sawtooth signal generator 7202 and a comparator 7203, as shown in FIG. 9 and taught in U.S. Pat. No. 11,271,480 B2 and/or application Ser. No. 18/048,852. The DAC 7201 generates an analog voltage $V_A$ according to the PWCC. The comparator 7203 compares a sawtooth signal (or sawtooth-like signal) $S_{saw}$ generated by the sawtooth signal generator 7202 with the analog voltage $V_A$, such that the PWM signal $S_{PWM}$ is generated. In this case, pulse width of the PWM signal $S_{PWM}$ would be proportional to the analog voltage $V_A$ as well as the PWCC.

According to the PWM signal(s) $S_{PWM}$, the switching circuit 722 performs charging operation, which diverts a current toward the PZT/capacitive load, when the load voltage is needed to be increased, and performs discharging operation, which forms a current from the PZT/capacitive load, when the load voltage is needed to be decreased.

Figure 10:
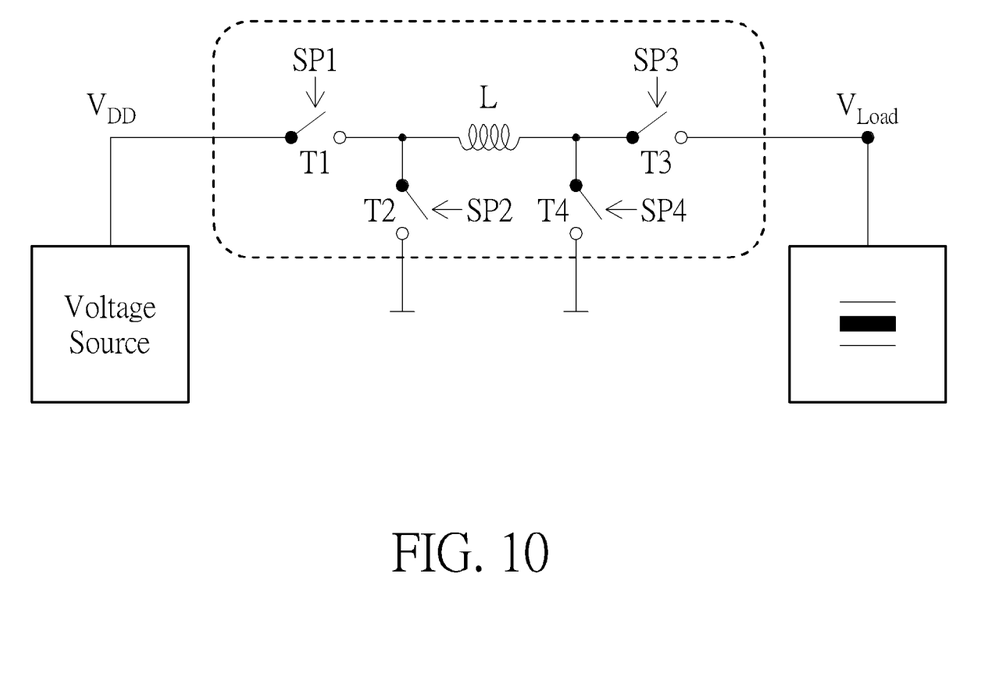
FIG. 10 is a schematic diagram of a switching circuit according to an embodiment of the present application.

Circuit topology of the switching circuit 722 is not limited. For example, the switching circuit 722 may comprise switches T1-T4 and an inductor L, as shown in FIG. 10 and taught in U.S. Pat. No. 11,336,182 B2, application Ser. No. 18/051,015 and application Ser. No. 18/048,852, which may own energy recycle capability. The switches T1-T2 are coupled to a first terminal of the inductor L and the switches T3-T4 are coupled to a second terminal of the inductor L. The switch T1 is coupled to a voltage source and the switches T3 is coupled to a load (e.g., a capacitive load).

Controller ctrl_1 within the FCS/circuit 70 comprises a memory 76 where a lookup table (LUT) 760 is stored therein. For explanation purpose, the lookup table 760 within the memory 76 can be viewed as a 2D table, but not limited thereto. Entries within the lookup table 760 may be arranged as a long 1-D array by one in the art, which is also within the scope of present application.

There are (at least) two types of observable operating conditions which can be inferred by signals IN and FB. The first type is which operation the circuit 70 shall operates, e.g., charging or discharging operation, within a coming operating cycle (or DC-DC cycle). The second type is how much the load voltage $V_{CL}$ currently is. The first type of operating condition needed to be identified is because current paths for charging operation and discharging operation are different. The second type of operating condition needed to be identified is because capacitance of PZT actuator would vary (actually decrease) as $V_{CL}$ increases, which affect pulse width of signal $S_{PWM}$ to achieve certain/specific change on $V_{CL}$.

The first type of operating condition can be identified by IN-FB (the measured error e). If IN−FB>0, it means charging operation should be performed in the coming DC-DC cycle. Otherwise, if IN−FB<0, it means discharging operation should be performed in the coming DC-DC cycle.

The second type of operating condition can be identified by FB or IN, where either FB or IN would provide good estimation of the load voltage $V_{CL}$ (and using IN to approximate $V_{CL}$ may provide better stability in some circumstance).

Row index m of the lookup table 760 of the present application indicates both what kind of operation the circuit 70 shall be performed in the coming operating cycle as well as how much load voltage $V_{CL}$ currently is (or how much $V_{PZT}$ is at an initial time of the coming operating cycle). Note that, U.S. Pat. No. 11,271,480 B2 mentioned that PWM control circuit may have a lookup table (201 in U.S. Pat. No. 11,271,480) for charging operation and a lookup table (202 in U.S. Pat. No. 11,271,480) for discharging operation. In one perspective, the lookup table 760 may be viewed as a stack of the lookup table for charging operation (201 in U.S. Pat. No. 11,271,480) and the lookup table for discharging operation (202 in U.S. Pat. No. 11,271,480). In another perspective, it can be viewed that the lookup table 760 may comprise a lookup table 7601 for charging operation and a lookup table 7602 for discharging operation.

Column index n of the lookup table 760, on the other hand, indicates how much voltage difference dV expected to be achieved via the DC-DC operation (i.e., charging or discharging operation) performed in the coming DC-DC cycle. In an embodiment, the voltage difference dV expected to be achieved may be expressed as n (the column index) times a step size ΔV, i.e., dV=n×ΔV, where the step size ΔV can be determined according to practical situation.

Note that, the voltage difference dV ideally can/should be negative of measured error e, i.e., dV=−e or dV=−(IN−FB). Hence, in one perspective, a row of the lookup table 760 can be viewed as an embodiment of the discretized transfer function, or the m-th row can be viewed as the discretized transfer function for operating condition m.

In short, according to sign(IN−FB), the controller ctrl_1 can determine which DC-DC operation shall be performed (where sign(x)=1 if x>0; sign(x)=−1 if x<0); according to IN or FB, the controller ctrl_1 can determine how much $V_{CL}$ is; according to |IN−FB|, the controller ctrl_1 can determine how much dV needed to be achieved. That is, according to IN and FB, the controller ctrl_1 can determine a table index as (m, n) to fetch corresponding table entry PWCC, denoted as $PWCC^{(m,n)}$ (shown in FIG. 7), to the plant 72, such that the PWM signal generator 720 can generate $S_{PWM}$ and the switching circuit 722 can perform DC-DC operation accordingly. Details of finding table address can be referred to U.S. Pat. No. 11,271,480 B2 and/or application Ser. No. 18/048,852, which is not narrated herein for brevity.

However, as stated earlier, (discretized) transfer function or the table may morph due to various non-observable factors. One of the (non-observable) factors causing the morphing transfer function or table may be variation of circuit parameter(s), such as permittivity/capacitance of the PZT actuator and/or inductance of the inductor within the switching circuit 722. Be aware that a tolerance of an inductor may be up to ±20%, which would be treated as normal situation but affect current through inductor significantly. Another (non-observable) factor is variation of battery voltage level, which may attenuate over time of usage and/or may be boosted when battery is recharged. All these factors affect an amount of the current driven by the switching circuit 722, such that voltage difference actually applied on the load, denoted as $dV_{actual}$, would deviate from voltage difference expected/intended to be on the load, denoted as $dV_{intend}$, within certain operating cycle. Distortion, such as total harmonic distortion (THD), would raise due to such deviation, which degrades audio system performance.

A remedy of overcoming such problem is to employ $2^{nd}$ tier feedback control scheme, to adaptively adjust the entries of the table. Similarly, the $2^{nd}$ tier feedback control scheme for the circuit 70 in FIG. 7 comprises the summing block SB2, the controller ctrl_2, the plant 72 and the ADC 74. In an embodiment, the summing block SB2 and the controller ctrl_2 may be embedded inside the controller ctrl_1, and the plant 72 and the ADC 74 are shared with the $1^{st}$ tier feedback control scheme.

For an operating cycle k, the controller ctrl_1 may output $PWCC_{org}^{(m,n)}$ as the $PWCC^{(m,n)}$ to the plant 72, and the plant 72 may perform the DC-DC operation based on the $PWCC^{(m,n)}$. At the end of the operating cycle k, the ADC 74 may convert $V_{CL}$ into a feedback signal $FB_k$. The sub-circuit 702 may compare the feedback signal $FB_k$ (corresponding to the current operating cycle k) with the feedback signal $FB_{k-1}$ (corresponding to the previous operating cycle k−1) to obtain the actual voltage difference $dV_{actual}^{(m,n)}$. In an embodiment, the sub-circuit 702 may compute the actual voltage difference $dV_{actual}^{(m,n)}$ as $dV_{actual}^{(m,n)}=FB_k-FB_{k-1}$. The summing block SB2 compares the actual voltage difference $dV_{actual}^{(m,n)}$ with the intended voltage difference $dV_{intend}^{(m,n)}$, and the controller ctrl_2 updates the PWCC on the address (m,n) of the LUT 760 (i.e., $PWCC^{(m,n)}$) according to a difference DD between $dV_{actual}^{(m,n)}$ and $dV_{intend}^{(m,n)}$. In an embodiment, the intended voltage difference $dV_{intend}^{(m,n)}$ can be determined as $dV_{intend}^{(m,n)}=n\times\Delta V$, where ΔV represents the step size.

In an embodiment, the summing block SB2 may compute the difference DD as $dV_{intend}^{(m,n)}-dV_{actual}^{(m,n)}$.

For example, the controller ctrl_2 may increase the PWCC when the difference DD indicates that the (dis) charging operation is insufficient, and decrease the PWCC when the difference DD indicates that the (dis)charging operation is excessive. For example, the controller ctrl_2 may increase the PWCC within the charging LUT when an actual voltage increment is less than an intended voltage increment (where voltage increment represents voltage difference for the charging operation), or the controller ctrl_2 may increase the PWCC within the discharging LUT when an actual voltage decrement is less than an intended voltage decrement (where voltage decrement represents an amount of voltage difference for the discharging operation). On the other hand, the controller ctrl_2 may decrease the PWCC within the charging LUT when an actual voltage increment is larger than an intended voltage increment, or the controller ctrl_2 may decrease the PWCC within the discharging LUT when an actual voltage decrement is larger than an intended voltage decrement.

In an embodiment, the controller ctrl_2 may produce $PWCC_{upd}^{(m,n)}=PWCC_{org}^{(m,n)}+1$ when the $PWCC^{(m,n)}$ is needed to be increased and produce $PWCC_{upd}^{(m,n)}=PWCC_{org}^{(m,n)}-1$ when $PWCC^{(m,n)}$ is needed to be decreased, which is not limited thereto.

In one perspective, $dV_{intend}^{(m,n)}$ may be viewed as the setpoint SP of the $2^{nd}$ tier feedback control scheme, and $dV_{actual}^{(m,n)}$ may be viewed as the measured process variable MP of the $2^{nd}$ tier feedback control scheme.

Details of the controller ctrl_2 producing $PWCC_{upd}^{(m,n)}$ may be referred to application Ser. No. 18/048,852, which is not narrated herein for brevity.

The $2^{nd}$ tier feedback control scheme within the circuit 70 is referred as table learning in application Ser. No. 18/048, 852. Effect of the $2^{nd}$ tier feedback control scheme within the circuit 70 can be referred to FIG. 8 thereof. As can be seen from FIG. 8 and related description in application Ser. No. 18/048,852, the sound quality is significantly improved by applying the $2^{nd}$ tier feedback control scheme or table learning operation.

In summary, given operation of the plant would be affected by various factors or operating conditions, the FCS of the present application utilities the $1^{st}$ tier feedback control scheme with table storing multiple transfer functions to deal with various operating conditions which are observable, and utilities the $2^{nd}$ tier feedback control scheme capable of learning the transfer functions to overcome factors which are unobservable.

In the present application, PV may be considered as a (system) output, CV may be regarded as a control signal, SP may be viewed as a (system) input signal, and MP may be interpreted as a measured output signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A feedback control system, comprising:
   a plant, configured to produce an output according to a control signal;
   a first summing block, configured to produce a first difference between an input signal and a measured output signal;
   a first controller, configured to generate the control signal, such that the first difference decreases to be less than a first threshold or is less than the first threshold;
   a second controller, coupled to a memory; and
   a second summing block, coupled to the second controller and configured to produce a second difference;
   wherein the first controller comprises the memory configured to store a table, and the table contains information of a plurality of transfer functions corresponding to a plurality of operating conditions;
   wherein the first controller determines an operating condition under which the plant operates, and chooses to utilize a transfer function corresponding to the operating condition to generate the control signal according to the transfer function and the first differences;
   wherein the second controller is configured to update the information contained in the table according to the second difference, such that the second difference decreases to be less than a second threshold or is less than the second threshold.

2. The feedback control system of claim 1,
   wherein the first controller determines the operating condition according to the input signal or the measured output signal.

3. The feedback control system of claim 1,
   wherein the table comprises a 2-dimensional array with a plurality of rows;
   wherein the plurality of rows represents a plurality of discretized transfer functions corresponding to the plurality of operating conditions.

4. The feedback control system of claim 1, wherein the first controller determines a row index of the table according to the input signal or the measured output signal.

5. The feedback control system of claim 1, wherein the first controller determines a column index of the table according to the first difference.

6. The feedback control system of claim 1,
   wherein the second summing block receives an intended quantity corresponding to a first operating condition when the first controller determines the plant operates under the first operating condition;
   wherein the second summing block produces the second difference between the intended quantity and an actual quantity corresponding to the first operating condition;
   wherein the second controller updates a first information corresponding to the first operating condition according to the second difference, such that the second difference corresponding to the first operating condition decreases to be less than the second threshold or is less than the second threshold.

7. The feedback control system of claim 6,
   wherein the first controller produces a first control signal corresponding to the first operating condition to the plant, and the plant operates and produces a first output according to the first control signal;
   wherein the second summing block obtains the actual quantity corresponding to the first operating condition according to the first output.

8. The feedback control system of claim 7,
   wherein the feedback control system comprises a sensor;
   wherein the sensor produces a first measured output signal according to the first output;
   wherein the feedback control system comprises a sub-circuit, coupled to the sensor and configured to produce the actual quantity corresponding to the first operating condition according to the first measured output signal.

9. The feedback control system of claim 1, where the feedback control system is configured to drive an actuator.

10. The feedback control system of claim 1,
    where the plant comprises a switching circuit configured to perform a DC-DC (direct-current to direct-current) operation on a load;
    wherein the DC-DC operation is a charging operation or a discharging operation.

11. The feedback control system of claim 10, wherein the plant further comprises a pulse width modulation (PWM) signal generator, configured to generate a PWM signal to control the switching circuit.

12. The feedback control system of claim 11, wherein the first controller produces a pulse width control code (PWCC) as the control signal to the PWM signal generator, such that the PWM signal generated by the PWM generator has a pulse width corresponding to the PWCC.

13. The feedback control system of claim 11, wherein the table comprise a 2-dimensional (2D) array, and an entry of the 2D array is a pulse width control code.

14. The feedback control system of claim 11,
    wherein the feedback control system comprises an analog-to-digital convertor (ADC) configured to produce a feedback signal as the measured output signal;
    wherein the first controller determines a row index for an operating cycle according to the input signal or the feedback signal generated by the ADC.

15. The feedback control system of claim 14,
    wherein the first summing block is coupled to the ADC and configured to produce the first difference between the input signal and the feedback signal generated by the ADC;
    wherein the first controller determines a column index for the operating cycle according to the first difference between the input signal and the feedback signal.

16. The feedback control system of claim 11, further comprising:
    a second controller coupled to the memory; and
    a second summing block, coupled to the ADC and configured to produces the second difference;
    wherein the second controller updates a pulse width control code (PWCC) stored in the table according to the second difference, such that the second difference decreases to be less than a second threshold or is less than the second threshold.

17. The feedback control system of claim 16,
    wherein the second summing block receives an intended voltage difference on the load corresponding to an operating cycle when the first controller fetches an original PWCC from a table address of the table for the operating cycle;
    wherein the second summing block produces the second difference between the intended voltage difference and an actual voltage difference corresponding to the table address;
    wherein the second controller produce an updated PWCC according to the second difference, such that the second difference corresponding to the table address decreases to be less than the second threshold or is less than the second threshold;

wherein the updated PWCC is saved to the table address of the table.

18. The feedback control system of claim 17, wherein the PWM signal generator generates the PWM signal according to the original PWCC;

wherein the switching circuit performs the DC-DC operation according to the PWM signal during the operating cycle;

where the plant produces a first output after the switching circuit performs the DC-DC operation in the operating cycle;

wherein the second summing block obtains the actual voltage difference corresponding to the table address according to the first output.

19. The feedback control system of claim 18, wherein the ADC produces a first feedback signal according to the first output;

wherein the feedback control system comprises a sub-circuit, coupled to the ADC and configured to produce the actual voltage difference corresponding to the table address according to the first feedback signal.

20. The feedback control system of claim 17, wherein the table address comprises a row index and a column index;

wherein the intended voltage difference is related to the column index.

21. A method applied in a feedback control system comprising a plant configured to produce an output according to a control signal, the method comprising:

determining an operating condition under which the plant operates;

choosing to utilize a transfer function corresponding to the operating condition among a plurality of transfer functions; and generating the control signal according to the transfer function;

wherein the feedback control system comprises a memory configured to store a table, and the table contains information of the plurality of transfer functions corresponding to a plurality of operating conditions;

wherein the method further comprises:

producing a first difference between an intended quantity and an actual quantity corresponding to a first operating condition; and updating the information contained in the table according to the first difference.

22. The method of claim 21, wherein the table comprise a 2-dimensional (2D) array with a plurality of rows;

wherein the plurality of rows represents a plurality of discretized transfer functions corresponding to the plurality of operating conditions;

wherein the method comprises:

determining a row index of the table according to an input signal or a measured output signal; and determining a column index of the table according to a second difference between the input signal and the measured output signal.

23. The method of claim 21, wherein the table comprise a 2-dimensional (2D) array with a plurality of rows;

wherein the plurality of rows represents a plurality of discretized transfer functions corresponding to the plurality of operating conditions;

wherein the method comprises:

updating an entry contained in the table according to the first difference.

* * * * *